United States Patent [19]

Allyn et al.

[11] 4,353,081

[45] Oct. 5, 1982

[54] GRADED BANDGAP RECTIFYING SEMICONDUCTOR DEVICES

[75] Inventors: Christopher L. Allyn, Morristown; Arthur C. Gossard, Warren; William Wiegmann, Middlesex, all of N.J.

[73] Assignee: Bell Telephone Laboratories, Incorporated, Murray Hill, N.J.

[21] Appl. No.: 116,622

[22] Filed: Jan. 29, 1980

[51] Int. Cl.³ .................... H01L 29/161; H01L 27/14
[52] U.S. Cl. .................................... 357/16; 357/30; 357/15; 357/88; 357/4
[58] Field of Search ...................... 357/16, 13, 15, 88, 357/4, 30

[56] References Cited

U.S. PATENT DOCUMENTS

| | | | |
|---|---|---|---|
| 3,132,057 | 5/1964 | Greenberg | 357/16 |
| 3,626,328 | 12/1971 | Esaki | 357/16 |
| 3,965,347 | 6/1976 | Heywang | 250/211 J |
| 4,122,476 | 10/1978 | Hovel | 357/16 |
| 4,137,542 | 1/1979 | Esaki | 357/16 |
| 4,149,174 | 4/1979 | Shannon | 357/13 |
| 4,160,238 | 7/1979 | Dawson | 357/16 |
| 4,163,237 | 7/1979 | Dingle | 357/4 |
| 4,173,763 | 11/1979 | Chang | 357/16 |
| 4,176,366 | 11/1979 | Delagebeaudeuf | 357/13 |
| 4,186,407 | 1/1980 | Delagebeaudeuf | 357/13 |
| 4,194,935 | 3/1980 | Dingle | 357/4 |

OTHER PUBLICATIONS

Oldham et al., *Solid State Electronics*, vol. 6, Pergamon Press, 1963, pp. 121–132.
Alferov et al., *Soviet Physics*, vol. 2, No. 10, Apr. 1969, pp. 1289 et seq.
Shannon, *Appl. Phys. Lett.*, 35(1), Jul. 1, 1979, pp. 63 et seq.
Chandra et al., *Electronic Letters*, vol. 15, No. 3, Feb. 1, 1973, pp. 90–91.

Primary Examiner—Martin H. Edlow
Attorney, Agent, or Firm—Michael J. Urbano

[57] ABSTRACT

A unipolar, rectifying semiconductor device is described. Rectification is produced by an asymmetric potential barrier created by a sawtooth-shaped composition profile of $Al_xGa_{1-x}As$ between layers of n-type GaAs. Single and multiple barriers, as well as doped and undoped barriers, show rectification. Also described is the incorporation of this type of device in an infrared detector, a hot electron transistor and mixer diodes.

11 Claims, 6 Drawing Figures

GRADED BANDGAP RECTIFYING SEMICONDUCTOR DEVICES

BACKGROUND OF THE INVENTION

Semiconductor diodes generally achieve rectification by means of asymmetric potential barriers created by carrier-depleted charge distributions (p-n junctions) or by electron affinity discontinuities at interfaces (Schottky barriers). The shape of these barriers cannot be controlled independently of charge carrier distributions, and cascading of a plurality of barriers is usually not possible. Recent work on diode structures has included rectification at n-n heterojunctions by A. Chandra et al., *Electronics Letters*, Vol. 15, page 90 (1979), control of current flow by a doping-produced potential hump in the bulk of a semiconductor material, J. M. Shannon, *Applied Physics Letters*, Vol. 35, page 63 (1979), and series connection of p-n diodes by degenerately doped tunnel junctions, M. Ilegems et al., *Applied Physics Letters*, Vol. 33, page 629 (1978).

In an early study of one of these device structures, the abrupt n-n heterojunction, W. G. Oldham et al. *Solid State Electron*, Vol. 6, page 121 (1963), proposed that unintentional compositional grading of the heterojunction resulted in the absence of rectification. Sixteen years later C. M. Garner et al., *Journal of Applied Physics*, Vol. 50, page 3383 (1979) reported the absence of rectification in n-n $Al_xGa_{1-x}As$-GaAs heterojunctions even though the compositional grading was apparently not large enough to explain the result. In contrast, although Chandra et al., supra, purport to achieve room temperature rectification in n-n $Al_xGa_{1-x}As$-GaAs, a report of their results at the January 1979 Conference on the Physics of Compound Semiconductor Interfaces, at Asilomar, Calif., raised considerable skepticism because, at room temperature, enough electrons should be thermally excited over the barrier to prevent rectification.

Thus, while prior work is somewhat contradictory on the impact which compositional grading in heterojunctions has on rectification, other work has exploited such grading to fabricate high voltage p-n junctions in $Al_xGa_{1-x}As$-GaAs, Zh. I. Alferov et al., *Soviet Physics Semiconductor*, Vol. 1, page 1313 (1968), to facilitate making the p-side contact in $Al_xGa_{1-x}As$ double heterostructure lasers, Zh. I. Alferov et al., *Soviet Physics Semiconductor*, Vol. 2, page 1289 (1969), to achieve a short wavelength $Al_xGa_{1-x}As$ laser, W. Heywang, U.S. Pat. No. 3,965,347, issued June 22, 1976, and to produce a drift field for the collection of photoelectrons in a GaAs-$Al_xGa_{1-x}As$ solar cell, H. J. Hovel et al., U.S. Pat. No. 4,122,476, issued on Oct. 24, 1978.

SUMMARY OF THE INVENTION

Our invention constitutes a new type of unipolar rectifying device which can be employed as a direct substitute for p-n junctions and Schottky barriers in a number of devices such as infrared detectors, hot electron transistors, and mixer diodes. In one embodiment of our invention, the device includes a graded bandgap semiconductor layer interposed between first and second narrower bandgap semiconductor layers characterized in that the narrower bandgap layers are of the same conductivity type and the thickness of the graded bandgap (or barrier) layer is large enough to prevent any substantial tunneling of carriers therethrough and yet smaller than the depletion length of carriers therein. A preferred embodiment has one or more of the following features: (1) the narrower bandgap layers are n-type in order to exploit the higher mobility of electrons; (2) the composition of the barrier layer is essentially a sawtooth function of thickness in order to realize asymmetric conduction; and (3) the barrier layer is lowly doped (e.g., unintentionally doped) in order to reduce energy band bending associated with the depletion of carriers therefrom.

The operation of the rectifying device can best be understood by first defining reverse and forward bias. Reverse bias means that a more negative voltage is applied to the second narrower bandgap layer which is adjacent the interface of the barrier layer having maximum bandgap; whereas forward bias means that a more negative voltage is applied to the first narrower bandgap layer which is adjacent the interface of the barrier layer having minimum bandgap. Briefly, in operation at or near zero bias, conduction in the direction perpendicular to the layers is inhibited by the barrier potential produced by the graded bandgap barrier layer. Under forward bias, the band edge potential of the first narrower bandgap layer is increased relative to that of the second layer, and the slope of the potential barrier is reduced. The reduced slope results in electrical conduction through thermionic emission of carriers over the reduced barrier from the first to the second layer. Under reverse bias, the band edge potential of the first layer relative to that of the second is decreased, and conduction is inhibited because, although carriers are attracted to the potential barrier, they are prevented by the abrupt step from passing therethrough.

We believe this to be the first rectifying structure in which the barrier has been produced directly by chemical composition grading and in which the barrier shape is not determined by band bending associated with charge carrier depletion. Preferably, the shape of the barrier is controlled by molecular beam composition during epitaxial growth. This technique allows flexible programming of barrier structure, including low barriers for operation at low voltage, cascaded barriers for high voltage operation, and barriers in which the width is chosen for desired reverse characteristics. As in the case with Schottky barriers, the forward and reverse conduction mechanisms in our rectifying structure are different, resulting in differing shapes to the turn-on region for forward and reverse voltages. However, the potential barrier which causes the rectification in our invention is designed into the material and results from a variation of electron affinity with respect to controllable chemical composition rather than from charge carrier depletion. As a result, the potential barrier can be tailored within relatively wide limits, and a series of such barriers can be integrated in a single sample. The unipolar nature of the conduction and the narrow barrier widths possible with molecular beam epitaxy may make possible applications of our structure to high speed circuits.

BRIEF DESCRIPTION OF THE DRAWING

Our invention, together with its various features and advantages, can be readily understood from the following more detailed description taken in conjunction with the accompanying drawing in which the figures are not drawn to scale for purposes of clarity and.

DETAILED DESCRIPTION

Figure 1:
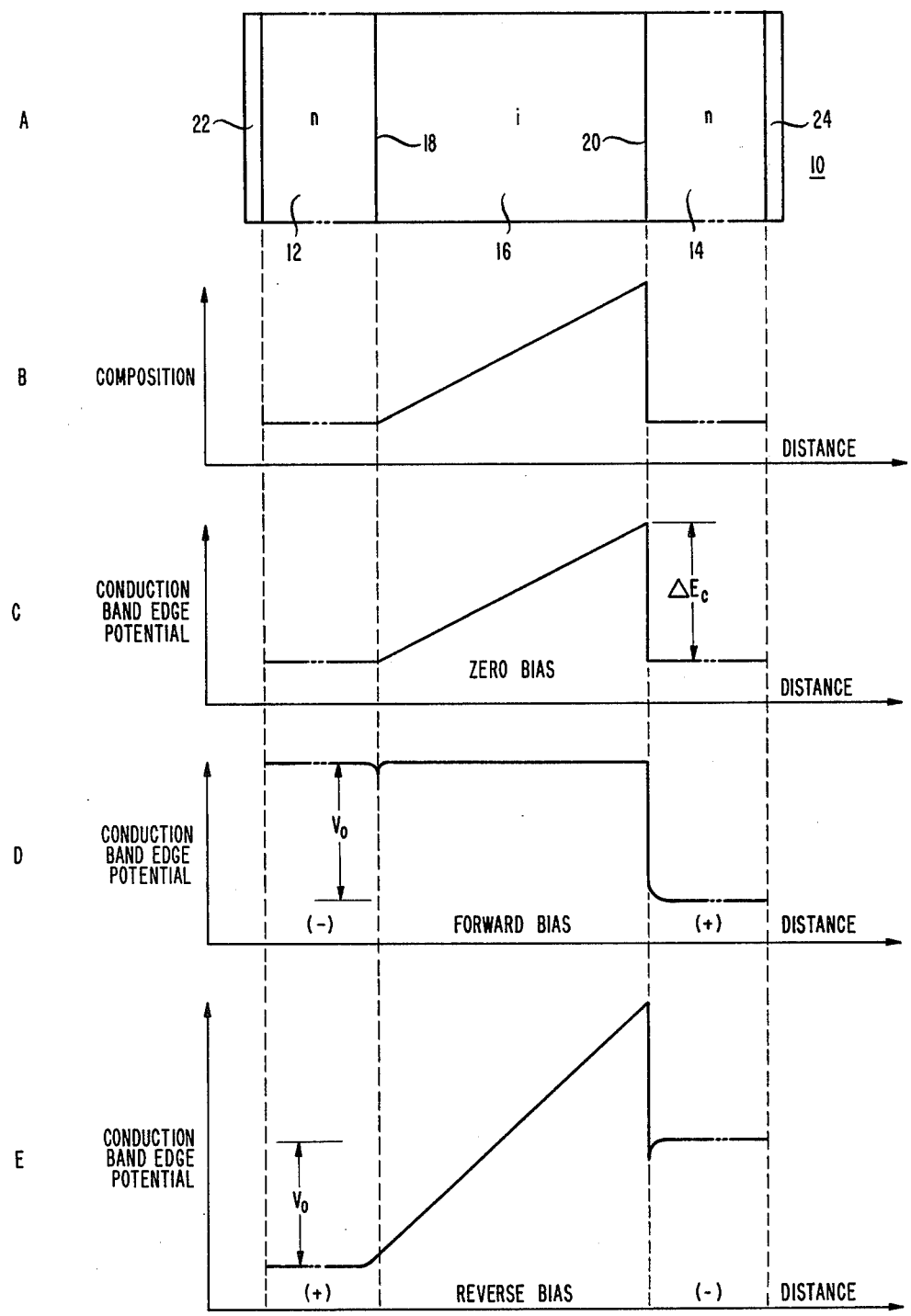
FIG. 1, PART A, is a schematic view of a unipolar rectifying device in accordance with one embodiment of our invention; PART B shows the composition profile of the semiconductor layers of PART A; and PARTS C, D, and E show the conduction band edge potential under zero, forward and reverse bias, respectively.

With reference now to FIG. 1, PART A shows an n-type unipolar rectifying semiconductor device 10 in accordance with an illustrative embodiment of our invention. The choice of n-type material is preferred because the mobility of electrons is greater than that of holes, but the use of p-type material is not excluded. Device 10 includes first and second relatively narrow bandgap n-type semiconductor layers 12 and 14 of the same conductivity type and a semiconductor barrier layer 16 interposed therebetween. The thickness of barrier layer 16 is large enough to prevent substantial tunneling therethrough, yet is smaller than the depletion length of carriers therein. In addition, its bandgap is graded as depicted by the conduction band edge potential diagram of PART C. That is, the bandgap of the barrier layer is generally larger than that of layers 12 and 14 but is smallest adjacent interface 18 with layer 12 and increases monotonically to interface 20 with layer 14 where it decreases abruptly (illustratively in a distance of 5–10 Angstroms). This shape of the potential can be effected by making the barrier layer 16 of a semiconductor material different from that of layers 12 and 14 and by grading the composition of the barrier layer as shown in PART B. Physically, the conduction band edge potential variation of PART C represents the composition dependence of the electron affinity of barrier layer 16. Advantageously, layers 12 and 14 comprises GaAs and barrier layer 16 comprises $Al_xGa_{1-x}As$ and are grown by MBE to have nearly atomically smooth interfaces, thus providing a conduction band potential variation free of extraneous charges bound in interface states. Illustratively, x increases monotonically, typically as a sawtooth function of distance, from x=0 at interface 18 to x=0.4 at interface 20. This configuration produces a depletion length of $\lesssim 0.5$ $\mu$m in layer 16 if it is lowly doped ($\lesssim 10^{16}$ cm$^{-3}$) and a conduction band step at interface 20 of approximately $\Delta E_c = 0.3 - 0.4$ eV. Preferably, the barrier is undoped (or unintentionally doped) so as to reduce band bending effects which tend to reduce the effective barrier height and thereby degrade the device performance at higher temperatures by allowing thermally excited electrons to traverse the barrier layer. Larger values of $\Delta E_c$ can be obtained by making the device from other semiconductors, e.g., $InAs-Al_xIn_{1-x}As$ in which the maximum $\Delta E_c \approx 1.7$ eV.

Conduction in the device 10 is controlled by the shape of the conduction band edge potential and the application of suitable voltages to electrodes 22 and 24 formed on layers 12 and 14, respectively. As mentioned previously, forward bias, as shown in PART D, means a more negative potential is applied to first layer 12 relative to second layer 14. Conversely, reverse bias, as shown in PART E, means a more negative potential is applied to layer 14. Near zero bias, as shown in PART C, conduction of electrons in the direction perpendicular to the layers is inhibited by the potential barrier of layer 16; that is, layer 16 is too thick to permit substantial tunneling and $\Delta E_c$ is large enough to prevent any substantial number of thermally excited electrons from getting over the barrier at the operating temperature of the device. When the device is biased in the forward direction, the voltage drop $V_o$ increases the band edge potential of layer 12 and reduces the slope of the potential barrier of layer 16. The reduced slope results in electrical conduction through thermionic emission of carriers over the reduced barrier from the first to the second layer. In the reverse direction, as shown in PART E, the applied voltage $V_o$ reduces the band edge potential of layer 12 and electrons will be attracted to, but inhibited from, passing through the abrupt potential step which, in the $GaAs-Al_xGa_{1-x}As$ materials system, can be made to be only 5 to 10 Angstroms wide. Reverse current by tunneling may be kept small by an adequately large thickness of the barrier layer.

EXAMPLE I

Three samples were synthesized using n-GaAs for layers 12 and 14 and $Al_xGa_{1-x}As$ for layer 16. Their dimensions, compositions, and carrier concentrations are given in the following table.

|  | Sample Number | | |
| --- | --- | --- | --- |
|  | 1 | 2 | 3 |
| Max. x of barrier layer 16 | 0.4 | 0.4 | 0.4 |
| Barrier layer width | 370 A | 490 A | 500 A |
| Barrier layer doping-type | n-type | n-type | undoped |
| Number of barrier layers | 1 | 5 | 1 |
| Separation between barrier layers | — | 2700 A | — |
| Electron concentration in layers 12 and 14 | $2 \times 10^{18}$ cm$^{-3}$ | $2 \times 10^{18}$ cm$^{-3}$ | $1 \times 10^{18}$ cm$^{-3}$ |

Silicon-doped n-type GaAs wafers with (100) faces cut, polished, and chemically etched were used as substrates. Growth took place in a molecular beam epitaxy chamber pumped by ion, sublimation and cryopumps to a starting vacuum in the mid $10^{-10}$ torr range. Evaporant sources were individually heated, cryopanelled and shuttered, and produced GaAs growth rates of ~200 Angstroms per minute. Aluminum content in the barrier layers was controlled by opening a shutter in close proximity to the one-centimeter-diameter oven orifice in eight discrete steps of ~15 seconds each and then abruptly closing the shutter in less than one second. Arsenic-rich growth conditions were employed, and n-type doping was produced by a silicon molecular beam, which is known to permit very sharp doping profiles. A substrate temperature of about 600 degrees C. was employed during growth.

In addition, in order to reduce contamination of the undoped $Al_xGa_{1-x}As$ barrier layer by impurities (such as CO) on the silicon oven shutter (leaf of Ta metal), this shutter was closed periodically (e.g., closed for 5 sec., open for 10 sec.) during growth of the n-GaAs first layer in order to bake off the impurities prior to growing the barrier layer.

An array of 20-mil diameter circular mesas was produced in the epitaxial layers by ion-milling over a photoresist mask to a depth greater than the depth of the barrier layer. Ohmic contact to the top surface of the mesa and to the n-type substrate were formed by alloying evaporated Au/12 weight percent Ge dots. The ohmic character of the contacts was verified by measurement of current-voltage (I-V) curves between pairs of substrate contacts. The contacts were found to be ohmic at all sample temperatures studied.

The I-V characteristics for the three samples were measured. The barrier layers of samples 1 and 2 were doped with Si to about $10^{18}$ Si atoms $cm^{-3}$. As previously mentioned, the potential barrier formed is expected to be reduced in such samples relative to that expected of an undoped barrier layer due to the charge depletion and accumulation resulting from the conduction band discontinuity. At room temperature, little evidence of rectification was seen. For both samples with doped barriers, the room temperature I-V curves were ohmic with resistances of $\sim 5\Omega$. However, the curves became rectifying at reduced sample temperature of 77 degrees K. as evidenced by I-V curves which exhibited asymmetric rectification. The forward turn-on voltage in each case was lower than the reverse turn-on voltage. In addition, the shape of the curves as conduction started was different for forward and reverse conduction. However, because of the high doping level in the barrier layers, the rectification observed in Samples 1 and 2 may be strongly influenced by depletion effects within the barrier. Thus, as previously discussed, a lowly doped barrier would be preferred.

Figure 2:
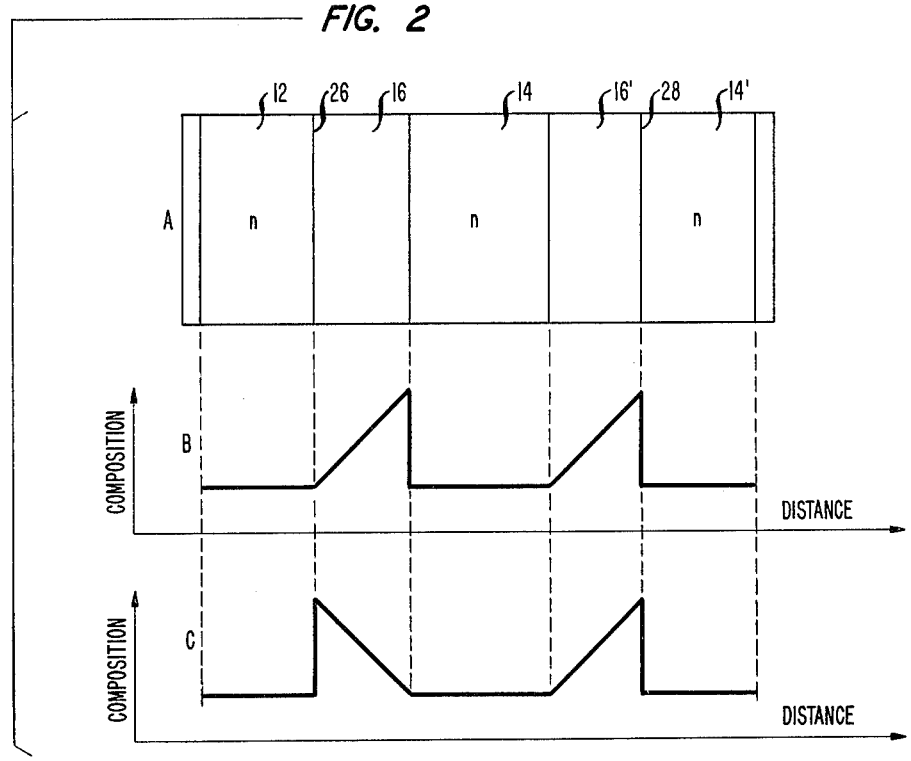
FIG. 2, PART A, is a schematic of another embodiment of our invention in which two devices of the type shown in FIG. 1 are connected in series; and PARTS B and C show different composition profiles in front-to-back and back-to-back arrangements, respectively.

The I-V curve for Sample 2 at 77 degrees K. also demonstrated that a plurality of rectifying devices could be connected in series to produce a structure having higher turn-on voltages. Sample 2 had a configuration of the type depicted in FIG. 2, PARTS A and B, except that five doped barrier layers of $Al_xGa_{1-x}As$, each 490 Angstroms thick, were interleaved with 2700 Angstrom thick layers of GaAs. The turn-on voltage was approximately five times that of the single device in the forward direction and approximately three times in the reverse direction.

In contrast, Sample 3 had a single undoped (i.e., unintentionally doped) barrier layer. As evidenced by its forward turn-on voltage, this device had a barrier potential considerably greater than for the doped single barrier of Samples 1 and 2 because of reduced band bending. This undoped barrier layer device exhibited rectification even at room temperature. There was considerable thermally activated conductivity (amounting to a slope equivalent to $\sim 150$ ohms at zero voltage) compared to the results at 77 degrees K. (where $>10^{+9}$ ohm zero-bias resistance was seen), but the asymmetric rectification was readily apparent.

A further advantage of our rectifying device, resulting from its independence of depletion layer effects, is that its capacitance should be nearly constant for all voltages between forward and reverse breakdown. We measured the C-V characteristics of the undoped barrier layer devices of Sample 3 at 77 degrees K. and found less than 3 percent variation for voltages between forward conduction ($+0.5$ V) and reverse conduction ($-1.4$ V). This result confirms the absence of depletion effects in the device operation, further supporting the barrier profile schematically illustrated in FIG. 1.

DEVICE APPLICATIONS

The unipolar rectifying device described above can be employed in a number of applications. One already described with reference to FIG. 2, PARTS A and B, includes a plurality of such devices connected in series to increase the turn-on voltages of the rectifier. In contrast, if a pair of rectifying devices are connected back-to-back, as depicted by the composition profile (or equivalently, bandgap profile) of FIG. 2, PART C, then the device of FIG. 2, PART A, will not conduct in either direction perpendicular to the layers until reverse breakdown occurs. This device includes a pair of barrier layers 16 and 16' interleaved with narrower bandgap layers 12, 14, and 14'. In the barrier layers 16 and 16', the compositions (or bandgaps) are graded in opposite directions, and the abrupt decreases in composition occur at interfaces 26 and 28 between the barrier layers and the outer narrow bandgap layers 12 and 14'.

Figure 3:
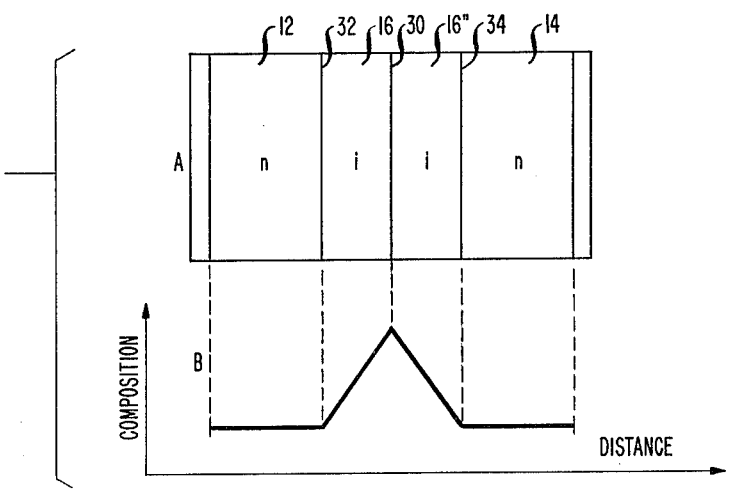
FIG. 3, PART A, is a schematic of a structure useful as a mixer diode with its composition profile depicted in PART B.

Another embodiment of our invention relates to millimeter wave receivers where it is sometimes advantageous to employ subharmonically pumped mixer diodes for signal detection. Such arrangements typically require a symmetric I-V characteristic which can be realized as shown in FIG. 3 by interposing a pair of contiguous barrier layers 16 and 16" between the relatively narrow bandgap layers 12 and 14 so that the compositions of layer 16 and layer 16" grade in opposite directions. In addition, the points of maximum composition (or bandgap) coincide with interface 30 between layers 16 and 16", whereas the points of minimum composition coincide with interfaces 32 and 34 between layers 16 and 16" and layers 12 and 14, respectively. We have fabricated this type of device using n-GaAs doped with Si to about $10^{18}/cm^3$ for layers 12 and 14 and undoped $Al_xGa_{1-x}As$ layers each 475 Angstroms thick to form layers 16 and 16". The value of x was graded from x=0 at interfaces 32 and 34 to x=0.42 at interface 30. Structures of this type exhibited symmetric I-V characteristics with turn-on voltages of 0.6–0.8 V in both directions.

Alternatively, the symmetric I-V characteristic can be realized in a device of the type shown in FIG. 3A without requiring that the barrier layers 16 and 16" be contiguous at interface 30. Instead, a third narrow bandgap layer may be interposed between them as shown by the composition profile of FIG. 4B. (Note, however, such a device would not require contact 52 shown in FIG. 4A.)

On the other hand, where an asymmetric I-V characteristic is desired, the composition profile of FIG. 3B may be modified so that layers 16 and 16" have different thicknesses.

Figure 4:
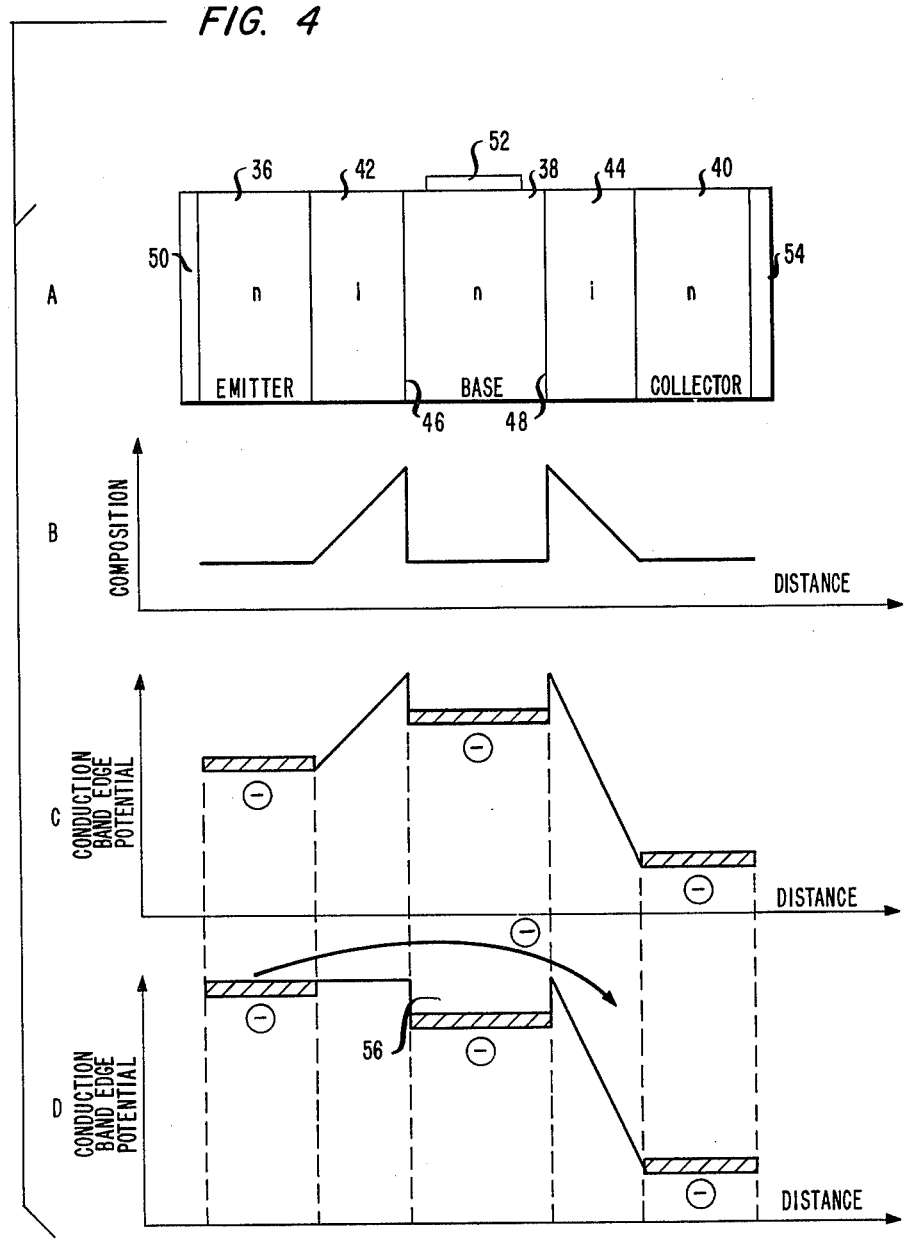
FIG. 4, PART A, is a schematic of a structure useful as a hot electron transistor with its composition profile depicted in PART B and its conduction band edge potential in the OFF and ON states depicted in PARTS C and D, respectively.

Our invention can also be embodied in a device known as the hot electron transistor described in principle by S. M. Sze in "Physics of Semiconductor Devices," pages 587–613 (Wiley-Interscience, New York, 1969). As shown in FIG. 4, PART A, three relatively narrow bandgap layers 36, 38, and 40 form respectively the emitter, base, and collector of the transistor. The rectifying junctions between these layers are formed by barrier layers 42 and 44 which are graded in opposite directions as shown in PART B so that the abrupt decrease in composition occurs at the interfaces 46 and 48 with the base 38. Suitable bias voltages are applied to the emitter, base, and collector electrodes 50, 52, and 54, respectively, to effect a conduction band edge potential depicted in PART C. Under these circumstances, the transistor is in its OFF state; that is, no electrons can flow from the emitter to the collector. Applying positive potential to the base electrode 52 depresses its conduction gand edge potential as shown in PART D, and hot electrons pass through the base layer 38 without dropping into the potential well 56. Since the base layer 38 is a high quality semiconductor material such as GaAs, less of the desired current flow would be scattered into the base than in prior art hot electron transistor designs.

Figure 5:
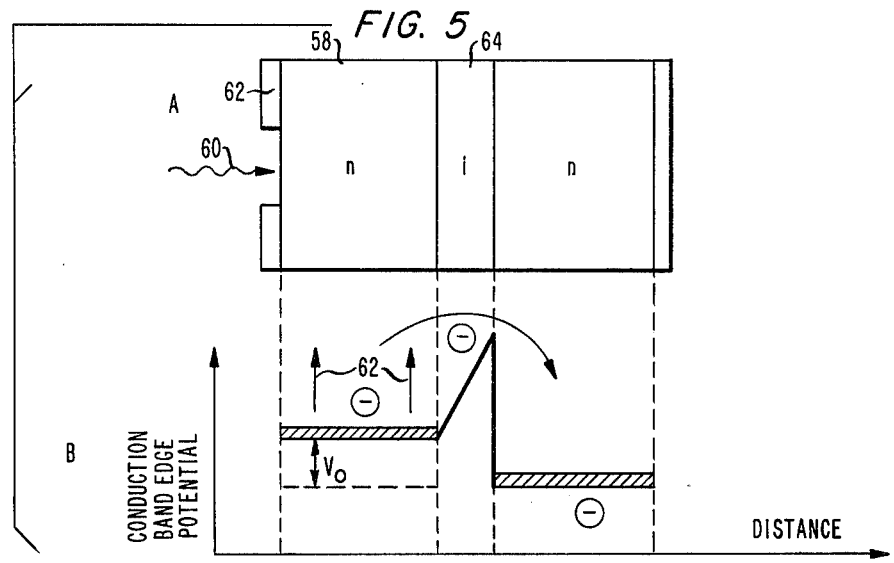
FIG. 5, PART A, is a schematic of a structure useful as an infrared detector with its conduction band edge potential depicted in PART B.

In the field of optical-to-electrical energy transducers, our invention can be employed in a tunable infrared detector as depicted in FIG. 5. This detector includes a three-layer structure of the same type depicted in FIG. 1 except that narrow bandgap layer 58 is made thick enough to absorb a substantial portion of the radiation 60 made incident on it through an aperture in electrode 62. Bias voltage $V_o$ is applied so as to increase the conduction band edge potential in layer 58 as shown in PART B and thereby adjust the minimum frequency of incoming radiation 60 which will be detected; i.e., the larger $V_o$, the smaller the photon energy of the radiation that can be detected. This radiation excites electrons in layer 58 as shown by the upwardly directed arrows 62, and these excited electrons can then pass over the potential barrier created in barrier layer 64. To this end, the thickness of layer 58 should be less than the electron means free path in order for the photexcited electrons to reach the barrier layer 64. In the GaAs-AlGaAs system, the electron mean free path would be in the order of 1000 Angstroms for a doping level of about $10^{18}$ cm$^{-3}$, and the absorption length would be approximately 5000 Angstroms for 0.1 mm wavelength photons. it is anticipated that this type of detector would be extremely fast because the transit time of electrons through the barrier layer 64 is very short, on the order of picoseconds.

Figure 6:
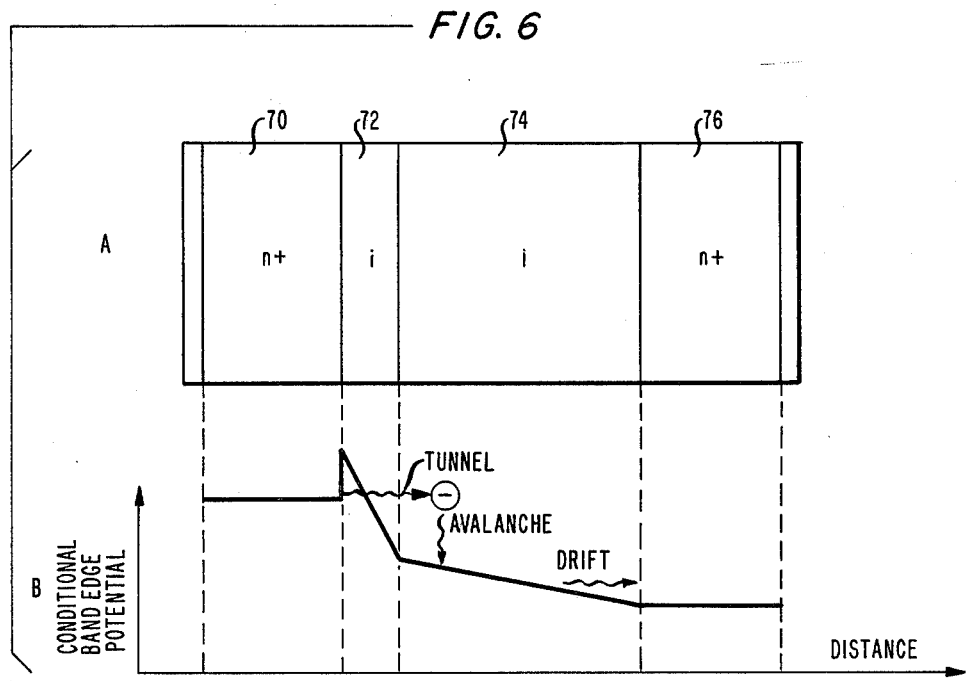
FIG. 6, PART A, is a schematic of a structure useful as a transit time oscillator with its conduction band edge potential depicted in PART B.

There are reverse biased graded barriers which can also be used to construct unipolar transit time oscillators such as IMPATT or BARITT oscillators. As is well known, these devices oscillate because of a phase difference between the applied voltage and the resulting current due to delay times in avalanche buildup and transit. One such configuration, shown in FIG. 6, PART A, includes an n+ narrow bandgap layer 70, a reverse biased graded bandgap barrier layer 72 thin enough to allow tunneling, an i-type narrow bandgap drift layer 74, and an n+ narrow bandgap layer 76. This device in operation has a conduction band edge potential as shown in PART B. Electrons tunnel from n+ layer 70 through the barrier layer 72 and then undergo avalanche multiplication and drift. If the energy of these tunneling electrons exceeds the bandgap in he drift layer 74, then electron-hole pairs will be created, and the device will generate microwave oscillations.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, various materials systems, especially those of the Group III-V system, cam be employed in our unipolar rectifying device. Thus, while we give examples of the use of GaAs-Al$_x$Ga$_{1-x}$As-GaAs devices, it is apparent that Al$_y$Ga$_{1-y}$As-Al$_x$Ga$_{1-x}$As-Al$_z$Ga$_{1-z}$As, with x graded from x=Y to some maximum value and x>z, could also be used. However, it would be preferred tha z=0 in order to maximize the conduction bandgap difference at the abrupt step between the Al$_x$Ga$_{1-x}$As and Al$_z$Ga$_{1-z}$As layers. A similar comment applies to the use of Al$_y$In$_{1-y}$As-Al$_x$In$_{1-x}$As-Al$_z$In$_{1-z}$As and Al$_y$Ga$_{1-y}$Sb-Al$_x$Ga$_{1-x}$Sb-Al$_z$Ga$_{1-z}$Sb.

We claim:

1. A semiconductor device (10) comprising
   first and second relatively narrow bandgap semiconductor layers (12, 14)
   a wider bandgap semiconductor layer (16) interposed between said first and second layers, said wider bandgap layer having a graded bandgap which increases from one of said first and second layers to the other, characterized in that said device is capable of unipolar rectification, and
   said first and second layers have the same conductivity type, and
   said wider bandgap layer is a barrier layer having a thickness large enough to prevent substantial tunneling therethrough and smaller than the depletion length of carriers therein.

2. The device of claim 1 wherein the bandgap between said second layer (14) and said barrier layer (16) changes abruptly at the interface therebetween.

3. The device of claim 2 wherein said bandgap changes abruptly in a distance on the order of 5–10 Angstroms.

4. The device of claims 1, 2, or 3 wherein said barrier layer is lowly doped.

5. The device of claim 4 wherein said first and second layers are n-type.

6. The device of claim 4 wherein said layers comprise Group III-V compounds selected from the group consisting of GaAs, InAs, AlAs, GaSb and AlSb and mixtures thereof.

7. A high voltage rectifying device comprising a plurality of devices according to claim 2 connected in series and in which the barrier layers all have their compositions graded in the same direction.

8. A device comprising a plurality of devices according to claim 2 connected in series and in which the bandgap of adjacent barrier layers is graded in opposite directions.

9. A mixer diode comprising a device according to claim 1 in which the bandgap of said barrier layer increases from a minimum value at the interfaces with said first and second layers to a maximum value at a point intermediate in said barrier layer.

10. A hot electron transistor comprising a device according to claim 2 in which said first layer forms an emitter and said second layer forms a base in combination with a third relatively narrow bandgap semiconductor layer which forms a collector and a second barrier layer according to claim 2 interposed between said second and third layers so that the bandgap of said barrier layers decreases abruptly at the interfaces with said base.

11. An infrared detector comprising a device according to claim 2 wherein radiation to be detected is made incident upon said first layer in order to optically excite carriers over the potential barrier of said barrier layer,
   said first layer being thick enough to absorb a substantial portion of said radiation and being thinner than the electron mean free path in said first layer.

* * * * *

UNITED STATES PATENT AND TRADEMARK OFFICE
CERTIFICATE OF CORRECTION

PATENT NO. : 4,353,081

DATED : October 5, 1982

INVENTOR(S) : Christopher L. Allyn, Arthur C. Gossard and William Wiegmann

It is certified that error appears in the above—identified patent and that said Letters Patent is hereby corrected as shown below:

Column 7, line 2, "biase" should read --bias--.
Column 8, line 3, "Y" should read --y--.

Signed and Sealed this

Eighth Day of February 1983

[SEAL]

Attest:

GERALD J. MOSSINGHOFF

Attesting Officer    Commissioner of Patents and Trademarks